United States Patent
Matsushige et al.

(10) Patent No.: US 6,702,175 B1
(45) Date of Patent: Mar. 9, 2004

(54) METHOD OF SOLDERING USING LEAD-FREE SOLDER AND BONDED ARTICLE PREPARED THROUGH SOLDERING BY THE METHOD

(75) Inventors: Kazumi Matsushige, 497, Hirookadani 2-chome, Gokasho, Uji-shi, Kyoto 611-0011 (JP); Toshihisa Horiuchi, Kyoto (JP); Takashi Ikari, Toyonaka (JP); Kenichiro Suetsugu, Nishinomiya (JP); Masato Hirano, Toyonaka (JP); Shunji Hibino, Hirakata (JP); Atsushi Yamaguchi, Mino (JP)

(73) Assignees: Matsushita Electric Industrial Co., Ltd., Osaka (JP); Kazumi Matsushige, Kyoto (JP)

(*) Notice: Subject to any disclaimer, the term of this patent is extended or adjusted under 35 U.S.C. 154(b) by 0 days.

(21) Appl. No.: 10/009,168

(22) PCT Filed: Jun. 7, 2000

(86) PCT No.: PCT/JP00/03678

§ 371 (c)(1),
(2), (4) Date: Dec. 7, 2001

(87) PCT Pub. No.: WO00/76708

PCT Pub. Date: Dec. 21, 2000

(30) Foreign Application Priority Data

Jun. 11, 1999 (JP) ............................. 11-165165

(51) Int. Cl.$^7$ ............................. B23K 1/06; B23K 20/12
(52) U.S. Cl. ..................... 228/110.1; 228/200
(58) Field of Search .............. 228/1.1, 110.1, 228/199, 200

(56) References Cited

U.S. PATENT DOCUMENTS

| | | | |
|---|---|---|---|
| 4,885,841 A | 12/1989 | McNabb | |
| 5,492,263 A | * 2/1996 | Webster et al. | 228/111 |
| 5,511,719 A | * 4/1996 | Miyake et al. | 228/106 |
| 5,730,932 A | 3/1998 | Sarkhel et al. | |
| 6,171,415 B1 | * 1/2001 | Statnikov | 148/525 |
| 6,271,601 B1 | * 8/2001 | Yamamoto et al. | 257/784 |
| 6,319,461 B1 | * 11/2001 | Domi et al. | 420/557 |

FOREIGN PATENT DOCUMENTS

| | | |
|---|---|---|
| DE | 32 40 540 | 6/1984 |
| EP | 0 787 559 | 8/1997 |
| EP | 1195217 A1 * | 4/2002 |
| JP | 6-7926 | 1/1994 |
| JP | 8-164477 | 6/1996 |
| JP | 10-216630 | 8/1998 |
| JP | 11-10385 | 1/1999 |
| JP | 02000351065 A * | 12/2000 |
| JP | 02001230272 A * | 8/2001 |
| WO | 99/12689 | 3/1999 |

OTHER PUBLICATIONS

US 2002/0056741 A1 Shieh et al. (May 16, 2002).*

(List continued on next page.)

*Primary Examiner*—Tom Dunn
*Assistant Examiner*—Kiley Stoner
(74) *Attorney, Agent, or Firm*—Wenderoth, Lind & Ponack, L.L.P.

(57) ABSTRACT

There are provided a method of soldering a lead-free solder which lowers a melting point of the lead-free solder and prevents deterioration of a joining strength at a portion joined by the lead-free solder, and a joined object soldered with the use of the soldering method. The lead-free solder as an alloy of tin with no lead contained is melted, and ultrasonic vibration is acted at least either to the join object to be joined by the lead-free solder or to the lead-free solder when the molten lead-free solder is solidified. Therefore crystals of contained components in the lead-free solder are made fine and the contained components are prevented from being segregated at a joining interface of the joined object, so that the joining strength at the joining interface can be increased.

14 Claims, 5 Drawing Sheets

OTHER PUBLICATIONS

US 2002/0031903 A1 Yamauchi et al. (Mar. 14, 2002).*
WO 00/76708 A1 Hibino et al. (Dec. 21, 2000).*
Patent Abstract of Japan, vol. 1997, No. 02, Feb. 28, 1997 & JP 08 252688 A (Fujitsu Ltd.), Oct. 1, 1996.
Patent Abstract of Japan, vol. 013, No. 230 (E–764), May 26, 1989 & JP 01 037077 A (Hitachi Ltd.), Feb. 7, 1989.
Patent Abstract of Japan, vol. 005, No. 002 (M–049), Jan. 9, 1991 & JP 55 136562 A (Hitachi Ltd.) Oct. 24, 1980.
Patent Abstract of Japan, vol. 1998, No. 04 Mar. 31, 1989 & JP 09 327791 A A (Uchihashi Estec Co., Ltd.), Dec. 22, 1997.

* cited by examiner

METHOD OF SOLDERING USING LEAD-FREE SOLDER AND BONDED ARTICLE PREPARED THROUGH SOLDERING BY THE METHOD

This application is a 371 application of PCT/JP00/03678, filed Jun. 7, 2000.

TECHNICAL FIELD

The present invention relates to a soldering method using a solder with no lead contained, that is, a lead-free solder, and a joined object soldered with the use of the soldering method.

BACKGROUND ART

In view of environmental protection and since lead included in solder based on Sn—Pb (tin-lead) used heretofore for fixing electronic components onto printed boards has a bad influence on not only the environment, but human bodies, solders not containing the lead, namely, lead-free solders have been under development lately. At present, the lead-free solders based on Sn—Cu (tin-copper), Sn—Ag (tin-silver), Sn—Zn (tin-zinc), Sn—Bi (tin-bismuth), Sn—In (tin-indium), In—Ag (indium-silver), etc. have been developed, and particularly the Sn—Cu based, Sn—Ag based and Sn—Zn based types have potentialities.

However, in comparison with a melting point, i.e., 183° C. of a conventional eutectic solder based on Sn—Pb containing lead, a lead-free solder of a composition, for example, of Sn-0.7Cu in the Sn—Cu has a melting point of 227° C., the Sn—Ag based lead-free solder in a composition of, e.g., Sn-3.5Ag has a melting point of 221° C., and the Sn—Zn based lead-free solder of a composition of, e.g., Sn-8Zn has a melting point of 199° C. Although the melting point of the Sn—Zn based type is lowest among these solders, since Zn is easy to oxidize and no effective means is found at present for preventing the oxidation, the Sn—Zn based lead-free solder involves problems to be solved before used to fix electronic components onto a printed board as described hereinabove. Under the circumstances, the potential lead-free solder now is the Sn—Cu based type and the Sn—Ag based type, but both of which have higher melting points by approximately 40° C. than that of the eutectic solder.

A heat resistant temperature of general electronic components is approximately 230° C. Therefore, a thermal allowance of approximately 50° C. is provided when the conventional eutectic solder is used to fix electronic components onto the printed board. However, the thermal allowance almost disappears in using, e.g., the Sn—Cu based and Sn—Ag based lead-free solders for the fixing. The thermal allowance is still more extreme for components weakly resistant to heat such as, for instance, aluminum electrolytic capacitors and the like.

For decreasing the melting points of the lead-free solders to or lower than the melting point of the conventional eutectic solder as much as possible, there is proposed lead-free solders in composition of, e.g., Sn-3.5Ag-6Bi, Sn-3.5Ag-3Bi-3In and the like having Bi (bismuth), In (indium) and the like added as a melting point decrease action metal acting to decrease the melting point.

The conventional eutectic solder changes almost instantaneously from a melt state to a solid state. On the other hand, the melting point of the lead-free solder decreases in proportion to an added amount of Bi when the Bi is added to the lead-free solder. But, when, for example, the Bi is added to the lead-free solder, a temperature range in which the lead-free solder changes from a melt state to a solid state expands as compared with that of the conventional eutectic solder. As a result, during solidification of the lead-free solder, the lead-free solder is brought into a state in which a partially solidified part and a part still in the melt state mix. Consequently, crystals of, e.g., Bi growing large in the lead-free solder 4 may segregation at a joining part 3 between an electronic component 1 and an electrode 2 of a printed board 5 as shown in FIG. 8. An enlarged illustration of the joining part in FIG. 8 diagrammatically shows a composition of the lead-free solder 4 at the joining part 3, in which a symbol "○" corresponds to, e.g., Bi and a symbol "□" corresponds to, e.g., Ag. A symbol "Δ" shown at a joining interfacial part to the electrode 2 corresponds to a compound of Cu as a material of the electrode 2 and Sn in the lead-free solder.

Meanwhile, Bi itself has a higher hardness than hardnesses of Sn and Ag. Therefore a strength of the lead-free solder at a part where Bi gathers due to the segregation of Bi crystals becomes brittle when the Bi is included by, e.g., several tens wt. % in the lead-free solder. A joining strength at the joining interfacial part decreases if the Bi crystals are unevenly distributed and then solidified at the joining interfacial part of the electrode 2, leading to the trouble that a sufficient joining strength cannot be obtained between the electrode 2 and the electronic component 1. A content of Bi at present is hence unavoidably limited to several wt. % from a view point of a reliability on the joining strength, and therefore the melting point cannot be sufficiently lowered at present. Since the melting point of the present lead-free solder is higher than the melting point of the eutectic solder as depicted above, for example, a larger power is inevitably required for melting the solder than when the eutectic solder is used, thereby raising problems in view of costs and saving energy. Further components of a low thermal resistance cannot be soldered with the use of the lead-free solder.

The present invention is devised to solve the above-described problems and has for its object to provide a method of soldering a lead-free solder which lowers a melting point of the lead-free solder and prevents deterioration of a joining strength at parts joined by the lead-free solder, and joined objects soldered with the use of the soldering method.

DISCLOSURE OF INVENTION

In accomplishing the above and other aspects, there is provided according to a first aspect of the present invention a method of soldering a lead-free solder which comprises:
melting the lead-free solder which is an alloy of tin with no lead contained; and
acting ultrasonic vibration for increasing a joining strength between a mount article and a member to be mounted to at least one of the mount article and the member to be mounted which are to be joined by the lead-free solder, and the lead-free solder when solidifying the molten lead-free solder.

The ultrasonic vibration can be such that makes crystals of components contained in the lead-free solder fine and prevents segregation of the contained components, and increases the joining strength between the mount article and the member to be mounted.

Moreover, the ultrasonic vibration may be such that makes crystals of components contained in the lead-free solder fine and prevents segregation of the contained components at a joining interface of at least either the mount article or the member to be mounted, and increases the joining strength between the mount article and the member to be mounted at the joining interface.

The contained components may include a component of a melting point decrease action metal for acting to decrease a melting point of the lead-free solder.

In the case where the mount article and the member to be mounted contain Cu, the ultrasonic vibration may be such that increases a thickness of a layer of a compound of Sn included in the lead-free solder and the Cu, the compound existing at the joining interface, and increases the joining strength between the mount article and the member to be mounted at the joining interface.

The lead-free solder may have a Sn—Ag based composition as a main ingredient.

When the lead-free solder has the Sn—Ag based composition as the main ingredient, the above-mentioned contained components may include an alloy component of the Sn—Ag.

The melting point decrease action metal can be at least one of Bi, Cu, Zn and In.

A joined object according to a second aspect of the present invention is soldered with the use of the method of soldering the lead-free solder of the first aspect.

According to the soldering method of the lead-free solder in the first aspect of the present invention, since the ultrasonic vibration is let to act when the molten lead-free solder is solidified, crystals of the components contained in the lead-free solder can be turned minute and prevented from segregating at the joining interface of at least one of the mount article and the member to be mounted which are to be joined by the lead-free solder, so that the joining strength between the mount article and the member to be mounted at the joining interface can be increased as compared with a case without the ultrasonic vibration acted.

In the joined object soldered with the use of the above soldering method according to the second aspect of the present invention, crystals of contained components of the lead-free solder are turned minute and prevented from segregating at the joining interfaces of the joined object as above, and the joining strength at the joining interfaces is increased as compared with the case where the ultrasonic vibration is not acted. The Joined object with a high joining strength can be provided accordingly.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
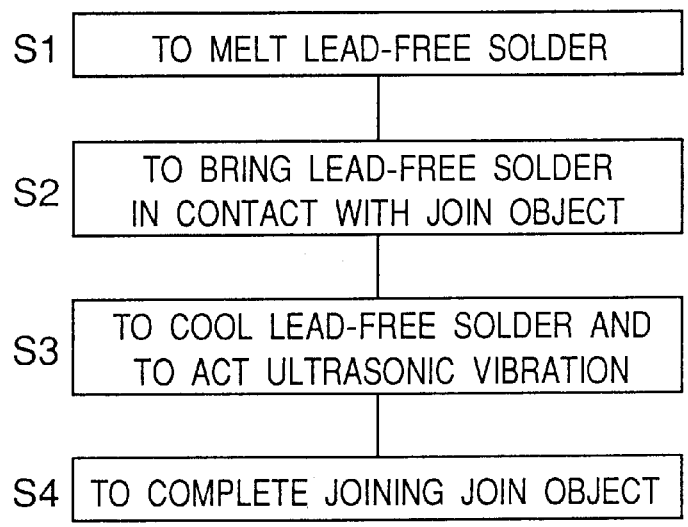
FIG. 1 is a flow chart showing processes of a lead-free solder soldering method according to an embodiment of the present invention.

A method of soldering a lead-free solder, and a joined object soldered with the use of the soldering method according to an embodiment of the present invention will be described below with reference to the drawings. It is to be noted here that like parts are designated by like reference numerals through the accompanying drawings.

According to the present embodiment, a printed board and an electronic component are given as examples of the joined object in the case where the electronic component as an example of a mount article is to be soldered onto the printed board as an example of a member to be mounted.

In the present embodiment, as an example of the solder which is an alloy of tin with no lead contained, i.e., a lead-free solder, a lead-free solder in which Bi as a metal acting to lower a melting point of the lead-free solder, that is, Bi as a melting point decrease action metal is added to the above Sn—Ag based solder is taken. However, the lead-free solder is not limited to this composition and can be the earlier-described Sn—Cu based type, Sn—Zn based type, Sn—Bi based type, Sn—In based type, In—Ag based type or the like, and the melting point decrease action metal to be added can be Bi, In, Cu or the like. The melting point decrease action metal exceeds by approximately 0.5 wt. %, is not limited to a single composition of, for instance, Bi or the like and may have an alloy containing, e.g., Bi or the like.

The method of soldering the lead-free solder has processes as shown in FIG. 1. A lead-free solder 101 used in the soldering method has a composition of Sn—Ag—Bi. A content of Bi is set to be 20 wt. % and 40 wt. %. A maximum value of the content of Bi is 58 wt. % (Sn-58Bi) where Bi is turned to a eutectic state to Sn without Ag included.

According to the soldering method of the lead-free solder in FIG. 1, in step (designated by "S" in the drawing) 1, the lead-free solder 101 in the composition of, for example, Sn-3.5Ag-40Bi is melted. In next step 2, for the earlier referred electronic component 1 and printed board 5 constituting the joined object, the lead-free solder 101 is brought in contact with a part 3 to be joined between the electronic component 1 and an electrode 2 on the printed board 5.

In next step 3, the lead-free solder 101 including the joined portion 3 is started to be cooled. Further, an ultrasonic horn of an ultrasonic oscillator is brought into contact with the printed board 5 so as to generate a vibration to at least the joined portion 3. The vibration has a frequency of a level at which crystals are made fine and prevented from being unevenly distributed as will be described later, that is, for example, an amplitude of several μm.

Figure 3:
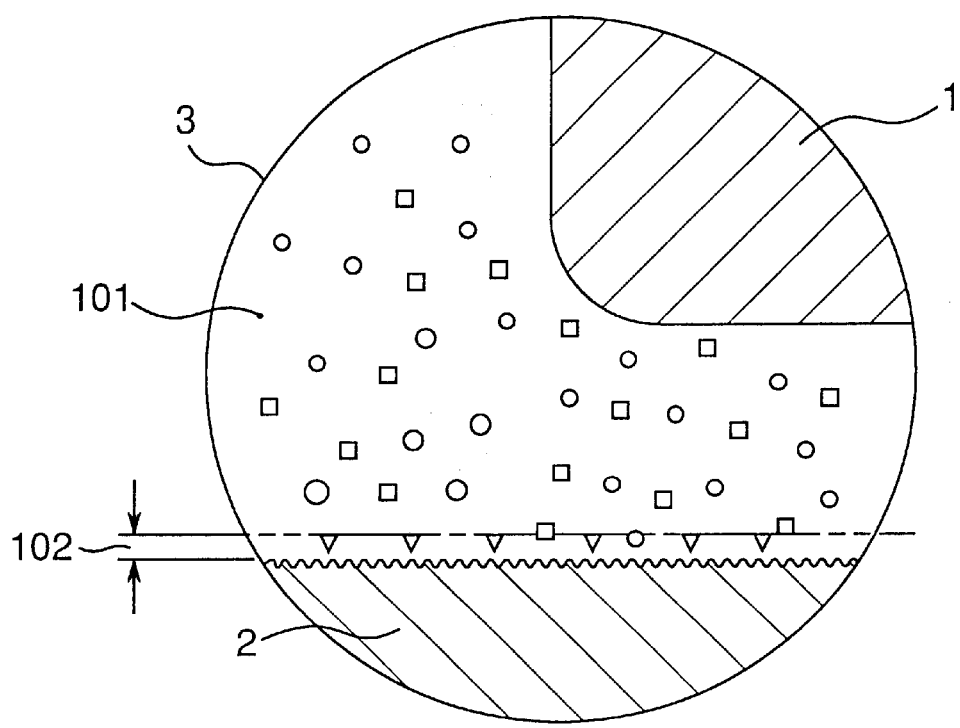
FIG. 3 is a conceptual diagram for explaining a state of crystals of contained components of the lead-free solder at a joining part between an electrode of a printed board and an electronic component when the ultrasonic vibration is acted in the soldering method of FIG. 1.
Figure 8:
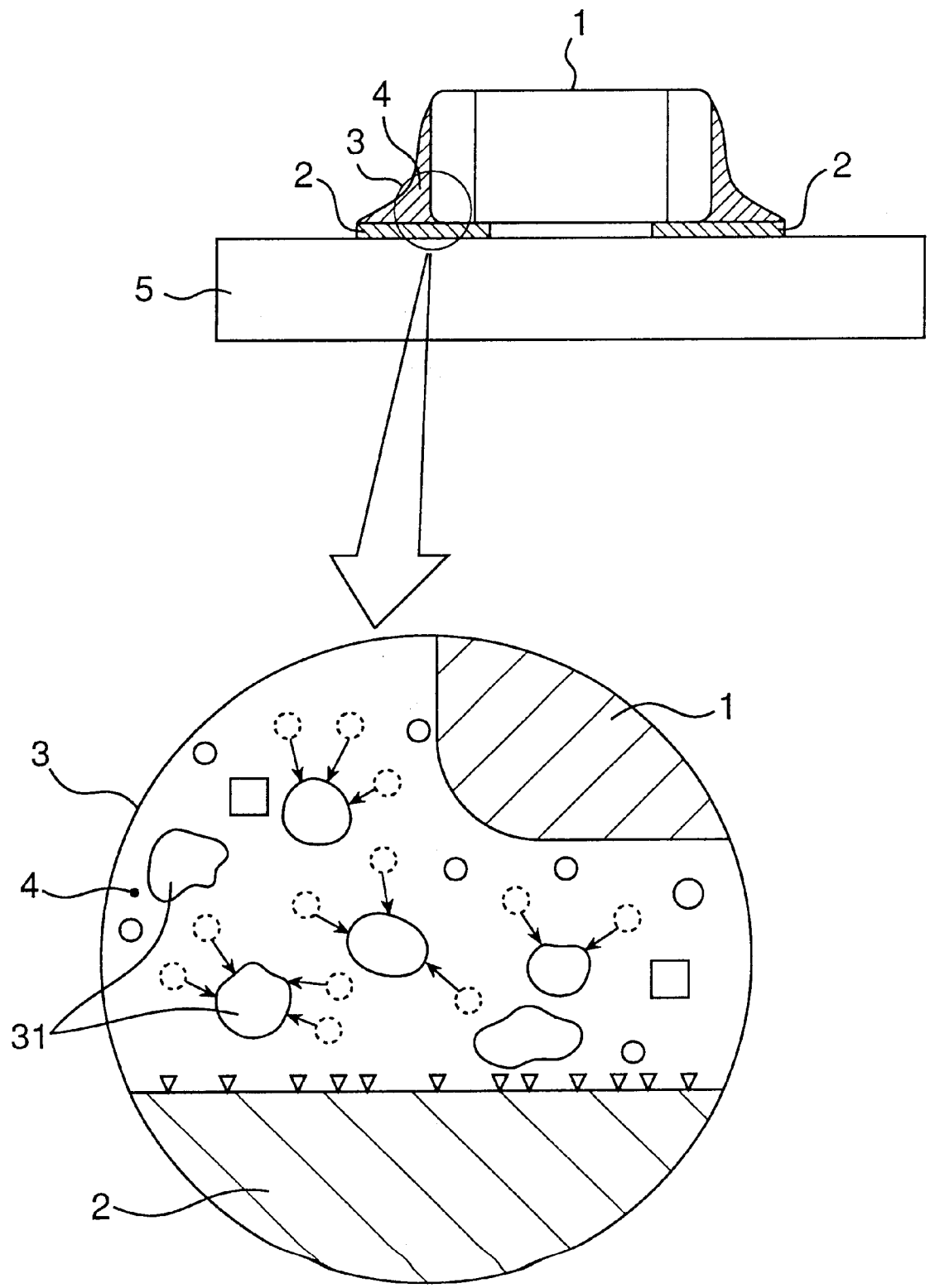
FIG. 8 is a conceptual diagram for explaining a state of crystals of contained components of the lead-free solder at the joining part between the electrode of the printed board and the electronic component when the ultrasonic vibration is not acted.

The lead-free solder 101 is vibrated by the ultrasonic vibration when the ultrasonic vibration is acted to the joined portion 3. Overgrown Bi crystals 31 as shown in FIG. 8 are turned fine as indicated in FIG. 3 owing to the action of the vibration and moreover the lead-free solder 101 is blended by the action of the vibration, so that Bi crystals can be prevented from being unevenly distributed, for instance, to a joining interface of the electrode 2. In consequence, crystals of Bi having a higher hardness than hardnesses of the other components in the lead-free solder 101, e.g., Sn, Ag or the like are prevented from being segregated and solidified in a state that the crystals of Bi are gathered to, for example, the joining interface of the electrode 2. In the case where Ag is included as components of the lead-free solder 101 of the present embodiment, although an alloy of Sn and Ag is formed and deposited, the ultrasonic vibration works to make fine crystals of this Sn—Ag alloy as well. The whole of the joined portion 3 is hence made nearly uniform in composition and moreover, crystals in each composition are made fine. Accordingly, a strength of the entire joined portion 3 is unified and the joining strength at the joining interface of the electrode 2 can be enhanced in comparison with the conventional art without the ultrasonic vibration acted.

Effects as follows can be further obtained by acting the ultrasonic vibration. Specifically, although a compound of Sn and Cu included in the lead-free solder 101 is formed to surface portions of the electrode 2 and an electrode of the electronic component 1 having Cu as a main ingredient as described above, a layer including the Sn—Cu compound is diffused to grow in the lead-free solder 101 by the ultrasonic vibration when the vibration is acted. The joining strength at the joining interface of the electrode 2 can be enhanced more by acting the ultrasonic vibration so that a thickness 102 of the layer including the Sn—Cu compound becomes an appropriate value. The joining strength is reversely weakened if the thickness 102 exceeds the appropriate value, and therefore the frequency and the ultrasonic vibration should be controlled.

Additionally, since a surface tension of the lead-free solder can be reduced by applying the ultrasonic vibration, a solderability can be improved and the joining strength can be enhanced.

As above, the amplitude value and the frequency at the joined portion 3 by the ultrasonic vibration are set to such values that components included in the lead-free solder, for example, Bi crystals as mentioned above are made fine at the joining interface of the joined object, crystals of the formed alloy such as Sn—Ag or the like are made fine, the contained components and the alloy crystals are prevented from segregating, and the joining strength of the electrode 2 of the printed board 5 and the electrode of the electronic component 1 at the joining interface is increased, and furthermore, the thickness of the layer including the Sn—Cu compound present at the joining interface is increased, thereby increasing the joining strength at the joining interface and also increasing the solderability.

Figure 2:
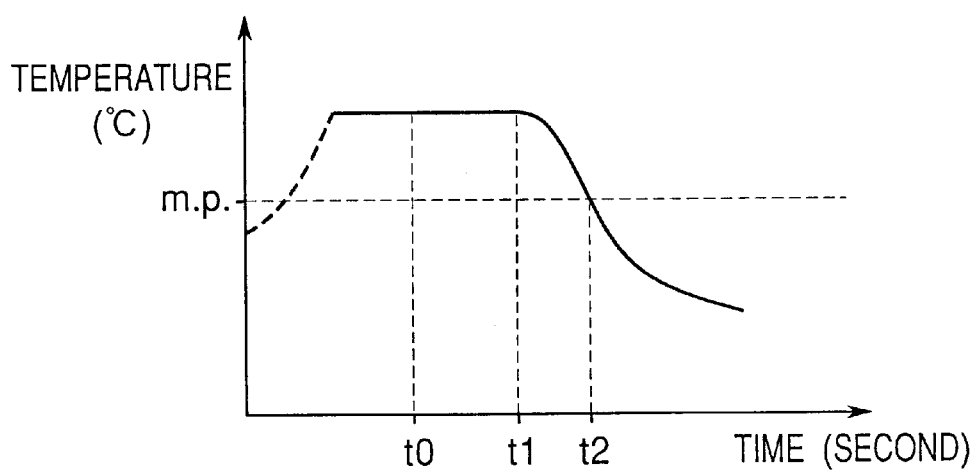
FIG. 2 is a diagram for explaining a timing for acting ultrasonic vibration in FIG. 1.

The ultrasonic vibration may be started to act concurrently with a time when the molten lead-free solder 101 is started to be cooled, as designated by a time t1 in FIG. 2 or may be started prior to the start of the cooling as indicated by a time t0. The action should be started at least immediately before a temperature of the lead-free solder reaches a solidifying temperature of the lead-free solder 101, as indicated by a time t2. An end time point of the action of the ultrasonic vibration is after the lead-free solder 101 is perfectly solidified.

Although it is preferable to continuously act the ultrasonic vibration, the vibration may be acted intermittently.

Figure 6:
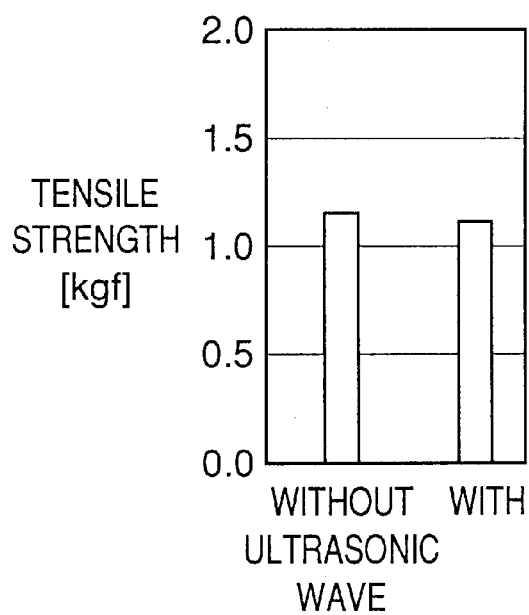
FIG. 6 is a graph of a relationship between the presence or absence of acting the ultrasonic vibration and the tensile strength in the lead-free solder of a composition of Sn-3.5Ag-6Bi.
Figure 7:
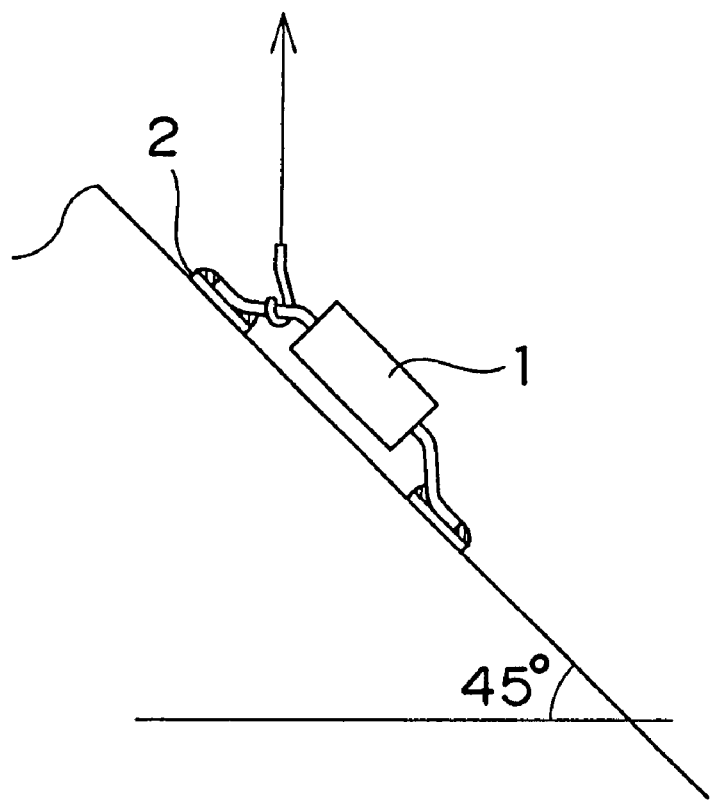
FIG. 7 is a diagram for explaining a method for measuring the tensile strength.

Experiments are conducted to obtain the joining strengths in the case where the ultrasonic vibration is acted as above and in the case where the ultrasonic vibration is not acted in the conventional art. A method for the experiment is shown in FIG. 7 and experiment results are shown in FIGS. 4–6.

According to the experiment method, while a lead wire of the electronic component 1 joined to the electrode 2 with the use of the lead-free solder is pulled in a 45° direction, separation between the lead wire and the electrode 2 and a tensile strength at a time when the lead wire or the electrode 2 reaches to brake are checked. FIG. 4 indicates the experiment result in the case of using the lead-free solder of a composition of Sn-3.5Ag-40Bi, while FIG. 5 shows the experiment result in the case of Sn-3.5Ag-20Bi and FIG. 6 shows the experiment result in the case of Sn-3.5Ag-6Bi. The lead-free solder of the composition of Sn-3.5Ag-40Bi has a melting point of approximately 180° C., the lead-free solder of the composition of Sn-3.5Ag-20Bi has a melting point of approximately 200° C., and the lead-free solder of the composition of Sn-3.5Ag-6Bi has a melting point of approximately 216° C.

Figure 4:
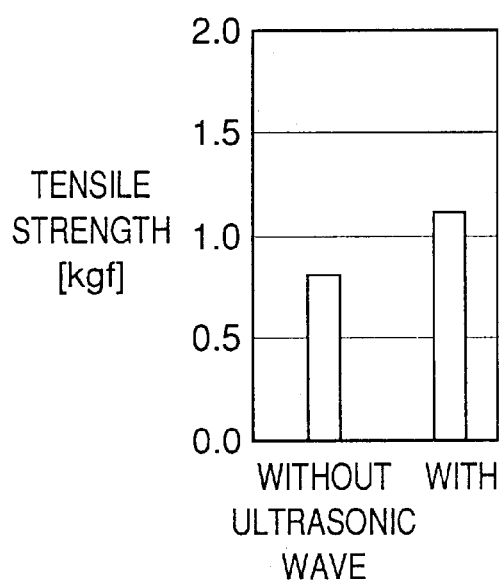
FIG. 4 is a graph of a relationship between the presence or absence of acting the ultrasonic vibration and a tensile strength in the lead-free solder of a composition of Sn-3.5Ag-40Bi.
Figure 5:
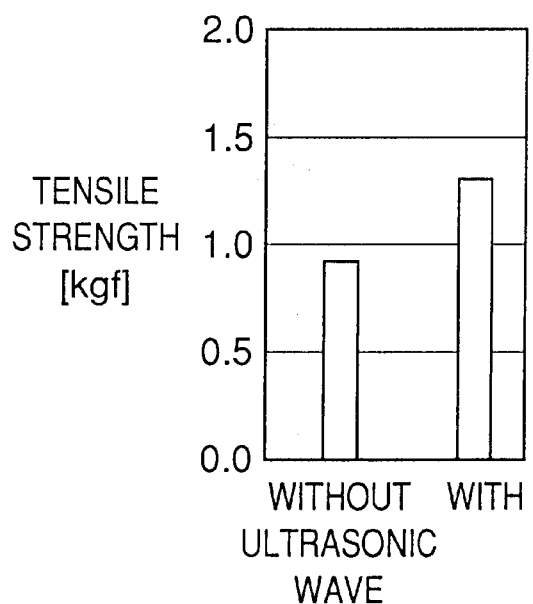
FIG. 5 is a graph of a relationship between the presence or absence of acting the ultrasonic vibration and the tensile strength in the lead-free solder of a composition of Sn-3.5Ag-20Bi.

As is apparent from the experiment results indicated particularly in FIGS. 4 and 5, the tensile strength is improved more when the ultrasonic vibration is acted than when the ultrasonic vibration is not acted. Further, as is made clear from the experiment results of FIGS. 4 and 5, and FIG. 6, the ultrasonic vibration acts effectively in the lead-free solder of a large content of Bi.

A reliability can be obtained even in the lead-free solder with a larger content of Bi than in the conventional art owing to the action of the ultrasonic vibration as above. Hence the lead-free solder of a lower melting point than that of the conventional lead-free solder becomes utilizable, enabling, for example, components of the weak heat resistance to be fixed to the printed board or the like by the lead-free solder. The power necessary for melting the lead-free solder can be lowered than for the conventional lead-free solder, which is effective to save energy and eventually contributes to protect the environment.

The entire disclosure of Japanese Patent Application No. 11-165165 filed on Jun. 11, 1999 including the specification, claims, drawings and summary is incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of soldering a lead-free solder which comprises:
   melting the lead-free solder which is an alloy of tin with no lead contained; and
   applying ultrasonic vibration to at least one of the lead-free solder, an article, and a member to be joined to the article by the lead-free solder when solidifying the molten lead-free solder, to increase joining strength between the article and the member.

2. The method of soldering the lead-free solder according to claim 1, wherein the ultrasonic vibration forms fine crystals of components contained in the lead-free solder and prevents segregation of the contained components, and increases the joining strength between the article and the member.

3. The method of soldering the lead-free solder according to claim 1, wherein at a joining interface of the lead-free solder to at least one of the article and the member, the ultrasonic vibration forms fine crystals of components contained in the lead-free solder and prevents segregation of the contained components, and increases the joining strength between the article and the member thereat.

4. The method of soldering the lead-free solder according to claim 2, wherein the contained components include a metal acting to decrease a melting point of the lead-free solder.

5. The method of soldering the lead-free solder according to claim 3, wherein the contained components include a metal acting to decrease a melting point of the lead-free solder.

6. The method of soldering the lead-free solder according to claim 3, wherein, when the article and the member contain Cu, the ultrasonic vibration is such that increases a thickness of a layer of a compound of Sn included in the lead-free solder and the Cu, the compound existing at the joining interface, and increases the joining strength between the article and the member at the joining interface.

7. The method of soldering the lead-free solder according to claim 2, wherein, when the article and the member contain Cu, the ultrasonic vibration is such that increases a thickness of a layer of a compound of Sn included in the lead-free solder and the Cu, the compound existing at the joining interface, and increases the joining strength between the article and the member at the joining interface.

8. The method of soldering the lead-free solder according to claim 4, wherein, when the article and the member contain Cu, the ultrasonic vibration is such that increases a thickness of a layer of a compound of Sn included in the lead-free solder and the Cu, the compound existing at the joining interface, and increases the joining strength between the article and the member at the joining interface.

9. The method of soldering the lead-free solder according to claim 5, wherein, when the article and the member contain Cu, the ultrasonic vibration is such that increases a thickness of a layer of a compound of Sn included in the lead-free solder and the Cu, the compound existing at the joining interface, and increases the joining strength between the article and the member at the joining interface.

10. The method of soldering the lead-free solder according to claim 1, wherein the lead-free solder has a Sn—Ag based composition as a main ingredient.

11. The method of soldering the lead-free solder according to claim 10, wherein the contained components include an alloy component of the Sn—Ag.

12. The method of soldering the lead-free solder according to claim 4, wherein the melting point decrease action metal is at least one of Bi, Cu, Zn and In.

13. The method of soldering the lead-free solder according to claim 6, wherein the melting point decrease action metal is at least one of Bi, Cu, Zn and In.

14. The method of soldering the lead-free solder according to claim 10, wherein the melting point decrease action metal is at least one of Bi, Cu, Zn and In.

\* \* \* \* \*

UNITED STATES PATENT AND TRADEMARK OFFICE
CERTIFICATE OF CORRECTION

PATENT NO. : 6,702,175 B1
DATED : March 9, 2004
INVENTOR(S) : Kazumi Matsushige et al.

It is certified that error appears in the above-identified patent and that said Letters Patent is hereby corrected as shown below:

Title page,
Item [56], References Cited, OTHER PUBLICATIONS, "Patent Abstract of Japan", vol. 1997, reference, correct to read -- Patent Abstract of Japan, vol. 005, No. 002 (M-049), Jan. 9, 1981 & JP55 136562 A (Hitachi Ltd.) Oct. 24, 1980 --.
"Patent Abstract of Japan", vol. 1998, reference, correct to read -- Patent Abstract of Japan vol. 1998, No. 04, Mar 31, 1998 & JP 09 327791 A (Uchihashi Estec Co., Ltd.), Dec. 22, 1997 --.

Signed and Sealed this

Twenty-seventh Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO.    : 6,702,175 B1
DATED         : March 9, 2004
INVENTOR(S)   : Kazumi Matsushige et al.

It is certified that error appears in the above-identified patent and that said Letters Patent is hereby corrected as shown below:

Title page,
Item [56], References Cited, OTHER PUBLICATIONS, "Patent Abstract of Japan", vol. 005, reference, correct to read -- Patent Abstract of Japan, vol. 005, No. 002 (M-049), Jan. 9, 1981 & JP55 136562 A (Hitachi Ltd.) Oct. 24, 1980 --.
"Patent Abstract of Japan", vol. 1998, reference, correct to read -- Patent Abstract of Japan vol. 1998, No. 04, Mar 31, 1998 & JP 09 327791 A (Uchihashi Estec Co., Ltd.), Dec. 22, 1997 --.

This certificate supersedes Certificate of Correction issued July 27, 2004.

Signed and Sealed this

First Day of February, 2005

JON W. DUDAS
*Director of the United States Patent and Trademark Office*